(12) United States Patent
Bai et al.

(10) Patent No.: US 11,264,409 B2
(45) Date of Patent: Mar. 1, 2022

(54) ARRAY BASE PLATE AND MANUFACTURING METHOD THEREOF, AS WELL AS DISPLAY PANEL COMPRISING THE SAME

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Nini Bai, Beijing (CN); Feng Kang, Beijing (CN); Liangliang Liu, Beijing (CN); Liang Tang, Beijing (CN); Zhiyong Xue, Beijing (CN); Hailong Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/756,143

(22) PCT Filed: May 31, 2019

(86) PCT No.: PCT/CN2019/089446
§ 371 (c)(1),
(2) Date: Apr. 15, 2020

(87) PCT Pub. No.: WO2019/228489
PCT Pub. Date: Dec. 5, 2019

(65) Prior Publication Data
US 2020/0303427 A1 Sep. 24, 2020

(30) Foreign Application Priority Data
May 31, 2018 (CN) .......................... 201820834824.2

(51) Int. Cl.
*H01L 27/10* (2006.01)
*H01L 27/12* (2006.01)

(52) U.S. Cl.
CPC ...... *H01L 27/1244* (2013.01); *H01L 27/1259* (2013.01)

(58) Field of Classification Search
CPC .................. H01L 27/1244; H01L 27/1259
(Continued)

(56) References Cited

U.S. PATENT DOCUMENTS

| 2004/0246420 A1 | 12/2004 | Morimoto et al. |
| 2007/0170854 A1 | 7/2007 | Kwak |

(Continued)

FOREIGN PATENT DOCUMENTS

| CN | 102236208 | 11/2011 |
| CN | 203983280 | 12/2014 |

(Continued)

OTHER PUBLICATIONS

International Search Report from PCT/CN2019/089446 dated Sep. 2, 2019.

*Primary Examiner* — Dzung Tran
(74) *Attorney, Agent, or Firm* — Calfee, Halter & Griswold LLP

(57) ABSTRACT

There is provided an array base plate, including: a substrate; a first patterned part disposed on the substrate and adjacent to an encapsulation region of the substrate; a second patterned part disposed on the substrate, in a same layer as the first patterned part and adjacent to the first patterned part; wherein the first patterned part includes a through part on its side close to the second patterned part. There is also provided a manufacturing method for manufacturing the array base plate, and a display panel including the array base plate.

18 Claims, 4 Drawing Sheets

(58) Field of Classification Search
USPC .......................................................... 257/763
See application file for complete search history.

(56) References Cited

U.S. PATENT DOCUMENTS

| | | | | |
|---|---|---|---|---|
| 2013/0095582 A1* | 4/2013 | Miyairi | ................... | H01L 51/56 |
| | | | | 438/26 |
| 2013/0101754 A1* | 4/2013 | Shimomura | ....... | B23K 26/0608 |
| | | | | 427/555 |
| 2013/0134398 A1* | 5/2013 | Yamazaki | ............. | H01L 51/525 |
| | | | | 257/40 |
| 2013/0137200 A1* | 5/2013 | Shimomura | ........ | H01L 33/0095 |
| | | | | 438/26 |
| 2014/0027743 A1* | 1/2014 | Nishido | ................... | B32B 15/18 |
| | | | | 257/40 |

FOREIGN PATENT DOCUMENTS

| | | |
|---|---|---|
| CN | 104777676 | 7/2015 |
| CN | 107994058 | 5/2018 |
| CN | 208142179 | 11/2018 |
| EP | 1814181 | 8/2007 |

\* cited by examiner

ARRAY BASE PLATE AND MANUFACTURING METHOD THEREOF, AS WELL AS DISPLAY PANEL COMPRISING THE SAME

RELATED APPLICATIONS

The present application is a 35 U.S.C. 371 national stage application of PCT International Application No. PCT/CN2019/089446, filed on May 31, 2019, which claims the benefit of Chinese Patent Application No. 201820834824.2, filed on May 31, 2018, the entire disclosures of which are incorporated herein by reference.

TECHNICAL FIELD

The present disclosure relates to the field of display technologies, and particularly to an array base plate and a manufacturing method thereof, as well as a display panel comprising the array base plate.

BACKGROUND

The array base plate of a display panel usually comprises a display region and an encapsulation region surrounding the display region. At present, the encapsulation region of a display panel is mostly encapsulated by laser. However, both the display region and the encapsulation region of the display panel are generally provided with metal wires. In the process of encapsulating the display panel by laser, due to the high encapsulating temperature of the laser, which is generally over 1200° C., it is easy to make the metal wires located in and around the encapsulation region partially overflow due to high temperature melting, resulting in short circuit between the metal wire and its adjacent metal wire to cause poor display in the display panel.

SUMMARY

According to an aspect of the present disclosure, there is provided an array base plate, including: a substrate; a first patterned part disposed on the substrate and adjacent to an encapsulation region of the substrate; a second patterned part disposed on the substrate, in a same layer as the first patterned part and adjacent to the first patterned part; wherein the first patterned part includes a through part on its side close to the second patterned part.

According to some exemplary embodiments of the present disclosure, the through part includes a slot extending along an extending direction of the first patterned part.

According to some exemplary embodiments of the present disclosure, the through part includes a plurality of slots parallel to each other and extending along an extending direction of the first patterned part, the plurality of slots correspondingly form a plurality of strips on the side of the first patterned part that is close to the second patterned part, and the plurality of strips are parallel to each other and extend along the extending direction of the first patterned part.

According to some exemplary embodiments of the present disclosure, along a direction from the first patterned part to the second patterned part, the closer a strip among the plurality of strips is to the second patterned part, the thinner the strip is.

According to some exemplary embodiments of the present disclosure, along a direction from the first patterned part to the second patterned part, the closer a slot among the plurality of slots is to the second patterned part, the wider the slot is.

According to some exemplary embodiments of the present disclosure, the through part includes a plurality of holes.

According to some exemplary embodiments of the present disclosure, a shape of each of the plurality of holes is selected from a group including circle, oval, triangle, rectangle, square and polygon.

According to some exemplary embodiments of the present disclosure, along a direction from the first patterned part to the second patterned part, the plurality of holes are arranged in a plurality of rows, each of which extending along an extending direction of the first patterned part.

According to some exemplary embodiments of the present disclosure, along the direction from the first patterned part to the second patterned part, the closer a row among the plurality of rows is to the second patterned part, the larger sum of areas of all the holes in the row.

According to some exemplary embodiments of the present disclosure, each hole has a same area, and along the direction from the first patterned part to the second patterned part, the closer a row among the plurality of rows is to the second patterned part, the larger number of holes in the row.

According to some exemplary embodiments of the present disclosure, each of the plurality of rows has a same number of holes, and along the direction from the first patterned part to the second patterned part, the closer a row among the plurality of rows is to the second patterned part, the larger area of each hole in the row.

According to some exemplary embodiments of the present disclosure, each hole has a same area, and each of the plurality of rows has a same number of holes.

According to some exemplary embodiments of the present disclosure, the first patterned part is provided with at least one encapsulation hole on its side that is far from the second patterned part.

According to some exemplary embodiments of the present disclosure, the first patterned part is a first metal wire, and the second patterned part is a second metal wire.

According to some exemplary embodiments of the present disclosure, the second metal wire is disposed in a display region of the substrate.

According to some exemplary embodiments of the present disclosure, the second metal wire includes a gate line or a data line.

According to some exemplary embodiments of the present disclosure, the first metal wire is a Cu thin-film wire, an Al thin-film wire, or a Ti—Al—Ti composite thin-film wire.

According to another aspect of the present disclosure, there is provided a display panel including the array base plate as stated above.

According to another aspect of the present disclosure, there is provided a manufacturing method for manufacturing the array base plate as stated above, including the steps of:

a) forming the first patterned part and the second patterned part on the substrate, such that the first patterned part is adjacent to the encapsulation region of the substrate, and the second patterned part is in the same layer as the first patterned part and adjacent to the first patterned part; and b) forming the through part on the side of the first patterned part that is close to the second patterned part.

According to some exemplary embodiments of the present disclosure, the through part includes at least one of: at least one slot and at least one hole.

BRIEF DESCRIPTION OF DRAWINGS

The exemplary embodiments of the present disclosure will be described in detail below with reference to the drawings, so as to facilitate better knowledge and understanding of the problems to be solved by the present disclosure, and the above and other objectives, features and advantages, wherein.

Figure 1:
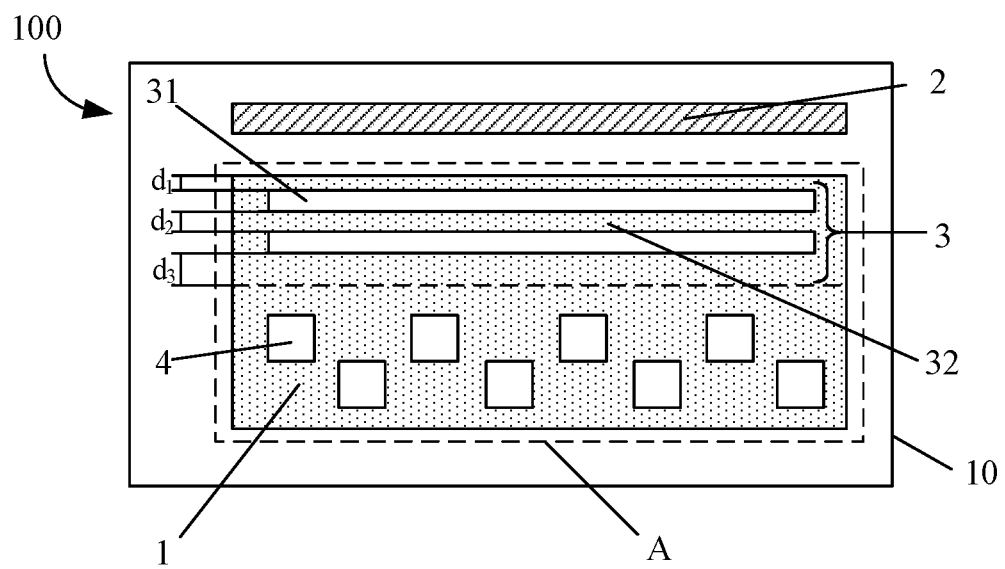
FIG. 1 is a schematic view of an array base plate according to some exemplary embodiments of the present disclosure.

Throughout all the drawings, like or similar reference numerals indicate like or similar components, elements, and parts. In addition, the drawings are only used for exemplary description of the present disclosure, so they only show the contents that are related to the present disclosure, and are not necessarily drawn in detail or drawn to scale.

DETAILED DESCRIPTION

For easy understanding, the array base plate, display panel and manufacturing method thereof according to the exemplary embodiments of the present disclosure will be described in detail below with reference to the drawings.

It will be understood that, although the terms "first", "second", "third" etc. may be used herein to describe various elements, components and/or portions, these elements, components and/or portions should not be limited by these terms. These terms are only used to distinguish one element, component or portion from another. Thus, a first element, component or portion discussed below could also be termed as a second or third element, component or portion without departing from the teachings of the present disclosure.

The terms used herein are for the purpose of describing particular embodiments only, and are not intended to be limiting the disclosure. As used herein, the singular forms "a", "an" and "the" are intended to include the plural forms as well, unless the context clearly indicates otherwise. It will be further understood that the terms "comprise" and/or "include," when used in this specification, specify the presence of stated features, entities, steps, operations, elements, and/or components, but do not preclude the presence or addition of one or more other features, entities, steps, operations, elements, components, and/or groups thereof. In addition, as used herein, the term "and/or" includes any and all combinations of one or more of the associated listed items.

It should be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

It should be noted that, in the description of the specification, the descriptions referring to the expressions such as "one embodiment", "some embodiments", "exemplary embodiments", "specific examples", or "some examples" and the like, are intended to mean the specific features, structures, materials or characteristics described in connection with the embodiments or examples are comprised in at least one embodiment or example of the present disclosure. Therefore, the schematic representation of the above descriptions herein is not necessarily directed to the same embodiment or example only. Rather, the specific features, structures, materials, or characteristics described may be combined in a suitable manner in any one or more embodiments or examples. In addition, various embodiments or examples described in the specification, as well as features of various embodiments or examples, may be combined or integrated by those skilled in the art without conflicting.

Some techniques, structures and materials commonly known in the art to which the disclosure belongs are not described in detail for the sake of clarity so as to avoid making the present application tediously long.

With reference to FIGS. 1 to 6, they show an array base plate 100 according to the exemplary embodiments of the present disclosure, comprising a substrate 10, and a first patterned part 1 and a second patterned part 2 disposed on the substrate 10. The first patterned part 1 is disposed on the inner side of and adjacent to an encapsulation region A of the substrate 10; and the second patterned part 2 is disposed outside the encapsulation region A and adjacent to the first patterned part 1. However, it can be easily understood that the above arrangement is not exclusive. In fact, the first patterned part 1 may be just disposed adjacent to the encapsulation region A, and the second patterned part 2 may be just disposed adjacent to the first patterned part 1. The first patterned part 1 is provided with a through part 3 on its side close to the second patterned part 2, and the through part 3 may comprise at least one slot and/or at least one hole.

In other exemplary embodiments according to the present disclosure, the first patterned part 1 may be a first metal wire, and the second patterned part 2 may be a second metal wire. Optionally, the second metal wire may be located within a display region of the substrate 10, and may comprise a gate line and/or a data line. However, it can be easily understood that the first patterned part 1 and the second patterned part 2 according to the exemplary embodiments of the present disclosure may be any part patterned on the substrate 10, and may be formed of any material, as long as the material will melt at a high temperature and subsequently cause a local overflow of the melted material.

In the array base plate 100 according to the exemplary embodiments of the present disclosure, the patterned part disposed adjacent to the encapsulation region A of the substrate 10 is defined as the first patterned part 1, the patterned part disposed adjacent to the first patterned part 1 is defined as the second patterned part 2, and the through part 3 is disposed on the side of the first patterned part 1 that is close to the second patterned part 2. The through part 3 may comprise at least one slot and/or at least one hole, and the shape of the slot and/or hole may be set according to actual needs, for example, the shape may be at least one of oval, circle, rectangle, square, triangle and polygon.

When the array base plate 100 according to the exemplary embodiments of the present disclosure is encapsulated by laser, the through part 3 may be utilized such that the material of the first patterned part 1 when melting at a high temperature may overflow into the through part 3, i.e. at least one hole and/or at least one slot, thereby effectively preventing the overflow of the material of the first patterned part 1 in the direction towards the second patterned part 2 due to melting at a high temperature, or effectively reducing the amount of the overflow of the material in the direction from the first patterned part 1 to the second patterned part 2, in such a way to effectively avoid conglutination between the first patterned part 1 and the second patterned part 2 due to the overflown material. In an exemplary embodiment in which the first patterned part 1 and the second patterned part 2 are metal wires, the risk of short circuit between these metal wires is avoided. Therefore, the array base plate 100 according to the exemplary embodiments of the present disclosure can reduce the risk of material conglutination (for metal wires, the material conglutination may cause short circuit) of the display panel including the array base plate, caused by laser encapsulation, which is beneficial to improve the product yield of display panels.

It can be understood that the first patterned part 1 and the second patterned part 2 are disposed in the same layer, that is to say, the first patterned part 1 and the second patterned part 2 may be formed in one patterning process. In an exemplary embodiment in which the first patterned part 1 and the second patterned part 2 are metal wires, the first patterned part 1 may be a Cu thin-film wire, an Al thin-film wire, or a Ti—Al—Ti composite thin-film wire, etc.; and the second patterned part 2 may be a thin-film wire made of the same material as the first patterned part 1.

The second patterned part 2 may be disposed outside the encapsulation region A of the substrate 10, for example, within a display region of the substrate 10 when, e.g., the second patterned part 2 is a metal wire comprising a gate line or a data line; or the second patterned part 2 may be disposed in a transition region between the display region and the encapsulation region A of the base 10 when, e.g., the second patterned part 2 is a metal wire like a peripheral connecting line such as a gate line or a peripheral connecting line such as a data line. The present disclosure makes no specific limitation in this regard.

With further reference to FIGS. 1 to 6, the first patterned part 1 and the second patterned part 2 are disposed adjacently, which usually means that the first patterned part 1 and the second patterned part 2 are disposed adjacently in the same direction, for instance, it may be shown that the lengthwise direction of the first patterned part 1 and that of the second patterned part 2 are substantially parallel to each other. In addition, the first patterned part 1 may be, e.g., located on the inner side of and adjacent to the encapsulation region A of the array base plate 100, so the first patterned part 1 is usually provided with at least one encapsulation hole 4 for applying encapsulation glue on its side far away from the second patterned part 2, such that the width of the first patterned part 1 is usually much greater than that of the second patterned part 2.

As stated above, in the array base plate 100 according to the exemplary embodiments of the present disclosure, the first patterned part 1 is divided into a side close to the second patterned part 2 and a side far away from the second patterned part 2, such that the encapsulation hole 4 is provided on the side of the first patterned part 1 that is far away from the second patterned part 2, and the through part 3 is disposed on the side of the first patterned part 1 that is close to the second patterned part 2. Thus, it can utilize the through part 3 to not only reduce the risk of material conglutination (for metal wires, short circuit therebetween) between the first pattered part 1 and the second patterned part 2 caused by laser encapsulation, but also function on the side of the first patterned part 1 that is close to the second patterned part 2 as the encapsulation hole 4, that is to say, the through part 3 may have two functions simultaneously, i.e., one is for preventing high-temperature overflow of the material of the first patterned part 1, and the other is for encapsulating the array base plate 100.

It is noteworthy that the through part 3 is disposed on the side of the first patterned part 1 that is close to the second patterned part 2, and the through part 3 may comprise one or more slots and/or holes. In the exemplary embodiments of the present disclosure, the through part 3 may comprise a plurality of slots and/or holes. The slots and/or holes contained in the through part 3 may be of the same shape, or different shapes, which can be set according to actual needs.

With reference to FIG. 1, the through part 3 of the first patterned part 1 comprises a plurality of slots 31 that are parallel to each other and extend in an extending direction of the first patterned part 1, i.e., extend in the lengthwise direction of the first patterned part 1, in such a way to define a plurality of strips 32 in the first patterned part 1. As shown in FIG. 1, along the direction from the first patterned part 1 to the second patterned part 2, the closer a strip among the plurality of strips 32 are to the second patterned part 2, the thinner the strip is. Thus, it can be ensured that, on the side of the first patterned part 1 that is close to the second patterned part 2, the closer to the second patterned part 2, the less material is required. In some exemplary embodiments of the present disclosure, the distance between every two adjacent slots 31 may be in direct proportion to the distance between a corresponding slot 31 and the second patterned part 2.

As shown in FIG. 1, the first patterned part 1 of the array base plate 100 is provided with two rectangular slots 31, the lengthwise direction of the two slots 31 are the same as that of the first patterned part 1, and the two slots 31 are the same in terms of length and width. The two slots 31 are arranged in parallel, thereby dividing the side of the first patterned part 1 that is close to the second patterned part 2 into three strips 32, the widths of which are respectively $d_1$, $d_2$ and $d_3$, wherein $d_1 < d_2 < d_3$ as shown in FIG. 1. Thus, on the side of the first patterned part 1 that is close to the second patterned part 2, the closer to the second patterned part 2, the less material is required. Thus, the material used on the side of the first patterned part 1 that is close to the second patterned part 2 is reduced, so as to ensure that the material of the first patterned part 1 when melting at a high temperature will not overflow in the direction towards the second patterned part 2, or only overflow slightly in the direction towards the second patterned part 2, in such a way to effectively reduce the risk of material conglutination between the first pattered part 1 and the second patterned part 2 caused by laser encapsulation.

Figure 2:
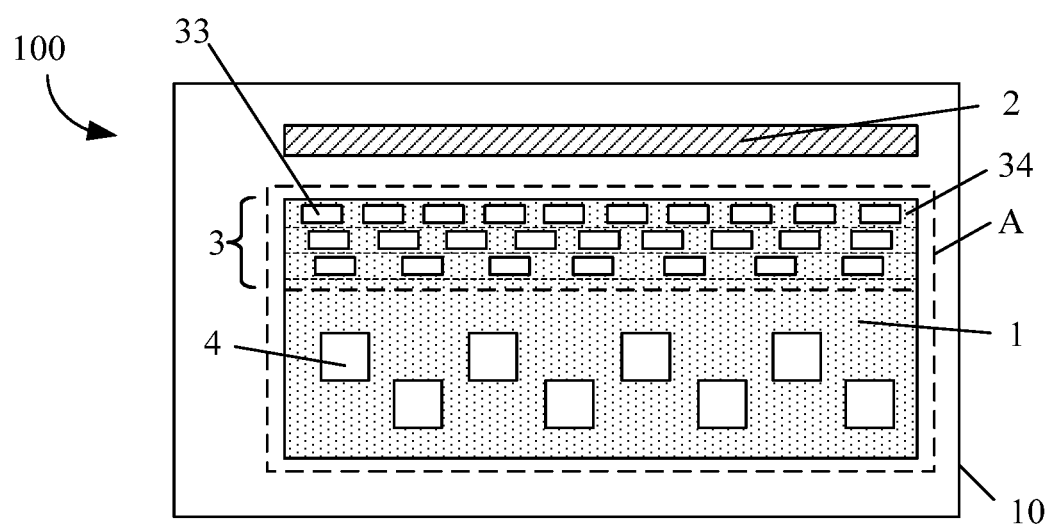
FIG. 2 is a schematic view of the array base plate according to other exemplary embodiments of the present disclosure.

With reference to FIG. 2, the through part 3 in the first patterned part 1 of the array base plate 100 as shown in FIG.

2 comprises a plurality of holes 33 with each having a rectangular shape and the same area. The plurality of holes 33 are arranged in a plurality of rows in the direction towards the second patterned part 2, and each row extends in the extending direction of the first patterned part 1, that is, in the lengthwise direction of the first patterned part 1. Along the direction from the first patterned part 1 to the second patterned part 2, the closer a row in the first patterned part 1 is to the second patterned part 2, the larger number of holes 33 in the row. That is to say, the portion of the first patterned part 1 that is close to the second patterned part 2 may be divided into a plurality of partitions 34 corresponding to the number of the rows formed by the plurality of holes 33. The partitions 34 have the same area, and each partition 34 may comprise a row of holes 33. As can be seen from FIG. 2, the closer the partition 34 is to the second patterned part 2, the larger number of holes 33 arranged in the partition 34, and the greater distribution density of the holes 33 the partition 34 has.

Furthermore, in some exemplary embodiments of the present disclosure, the distribution density of the holes 33 may be in reverse proportion to the distance between the row in which the holes 33 are located and the second patterned part 2; that is to say, according to the distance between the row in which the holes 33 are located and the second patterned part 2, the closer the row is to the second patterned part 2, the larger number of holes 33 arranged in the row, and the number of holes 33 in each row is in a fixed ratio with the distance. Of course, in some exemplary embodiments of the present disclosure, the ratio of the area of the plurality of holes 33 in each partition 34 to the area of the partition 34 may be used as the distribution density of the holes 33 in this partition. The higher the ratio is, the greater the distribution density of the holes 33 in the partition is.

The closer to the second patterned part 2, the greater the distribution density of the holes 33 is, such that on the side of the first patterned part 1 that is close to the second patterned part 2, the closer to the second patterned part 2, the less material is required, thereby reducing the material used for the side of the first patterned part 1 that is close to the second patterned part 2, so as to ensure that the material of the first patterned part 1 when melting at a high temperature will not overflow in the direction towards the second patterned part 2, or only overflow slightly in the direction towards the second patterned part 2, in such a way to effectively reduce the risk of material conglutination between the first pattered part 1 and the second patterned part 2 caused by laser encapsulation.

Figure 3:
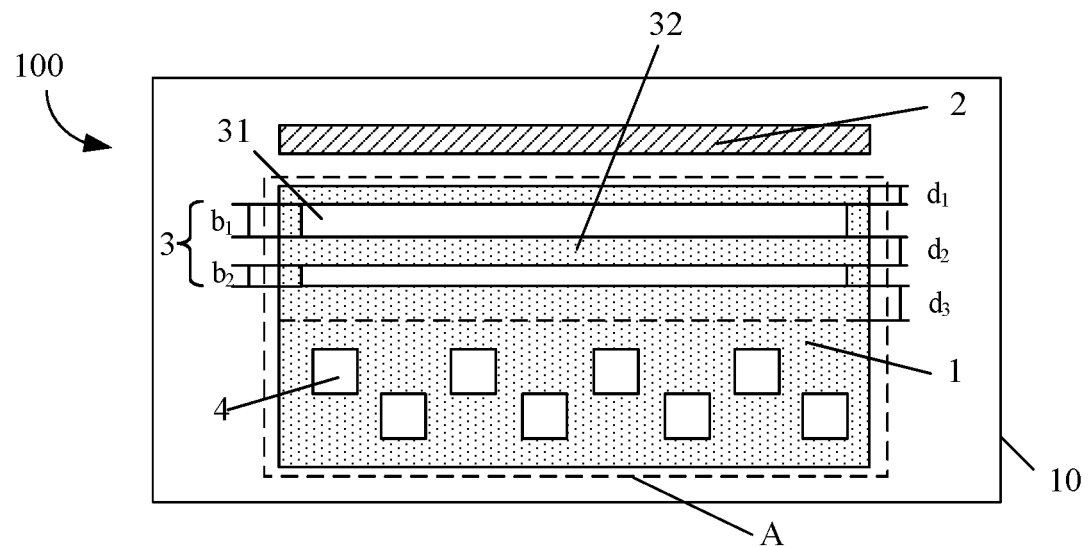
FIG. 3 is a schematic view of the array base plate according to further exemplary embodiments of the present disclosure.
Figure 4:
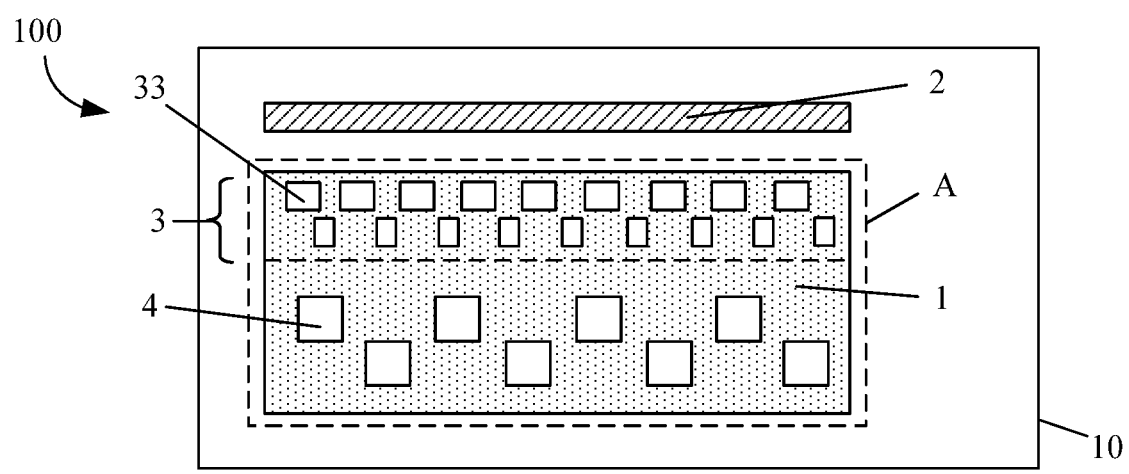
FIG. 4 is a schematic view of the array base plate according to further exemplary embodiments of the present disclosure.
Figure 5:
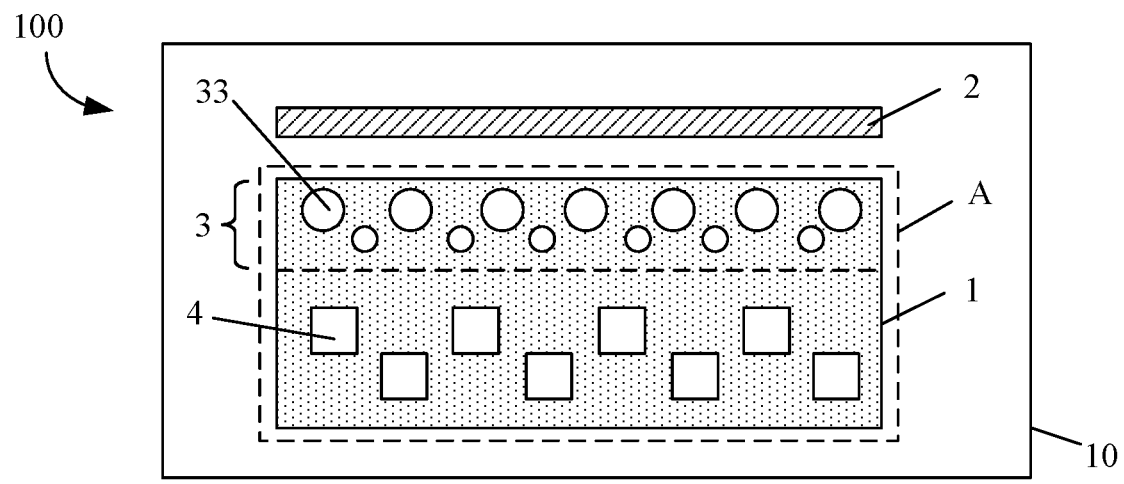
FIG. 5 is a schematic view of the array base plate according to further exemplary embodiments of the present disclosure.

With reference to FIGS. 3 to 5, the through parts 3 are of different structures. For example, the through part 3 may comprise a plurality of slots or holes. But each through part 3 is used for the purpose of reducing material on the side of the first patterned part 1 that is close to the second patterned part 2. Optionally, the closer the portion of the first patterned part 1 is to the second patterned part 2, the less material is required, so as to ensure that the material of the first patterned part 1 when melting at a high temperature will not overflow in the direction towards the second patterned part 2, or only overflow slightly in the direction towards the second patterned part 2.

Take the array base plate 100 as shown in FIG. 3 as an example. The first patterned part 1 of the array base plate 100 is provided with the through part 3 comprising two slots 31, the lengthwise direction of the two slots 31 is the same as that of the first patterned part 1, and the two slots 31 are the same in term of length. The closer a slot 31 of the two slots 31 is to the second patterned part 2, the wider the width of the slot 31 is, e.g., $b_1 > b_2$ as shown in FIG. 3. Thus, the two slots 31 divides the side of the first patterned part 1 that is close to the second patterned part 2 into three strips 32, and the closer a strip 32 is to the second patterned part 2, the narrower the width of the strip 32 is, e.g., $d_1 < d_2 < d_3$ as shown in FIG. 3, such that on the side of the first patterned part 1 that is close to the second patterned part 2, the closer to the second patterned part 2, the less material is required. Therefore, the material used for the side of the first patterned part 1 that is close to the second patterned part 2 is reduced, so as to ensure that the material of the first patterned part 1 when melting at a high temperature will not overflow in the direction towards the second patterned part 2, or only overflow slightly in the direction towards the second patterned part 2, in such a way to effectively reduce the risk of material conglutination between the first pattered part 1 and the second patterned part 2 caused by laser encapsulation.

In addition, the array base plate 100 shown in FIGS. 4 and 5 adopts the same principle as the array base plate 100 shown in FIG. 3, but with adaptive changes to the number and shape of the structures included in the through part 3. For example, the through part 3 in FIGS. 4 and 5 comprises a plurality of holes 33 arranged in multiple rows, and the hole 33 in the row that is closer to the second patterned part 2 has a larger area, such that less material is required on the side of the first patterned part 1 that is closer to the second patterned part 2. The array base plate shown in FIGS. 4 and 5 will not be reiterated herein.

Figure 6:
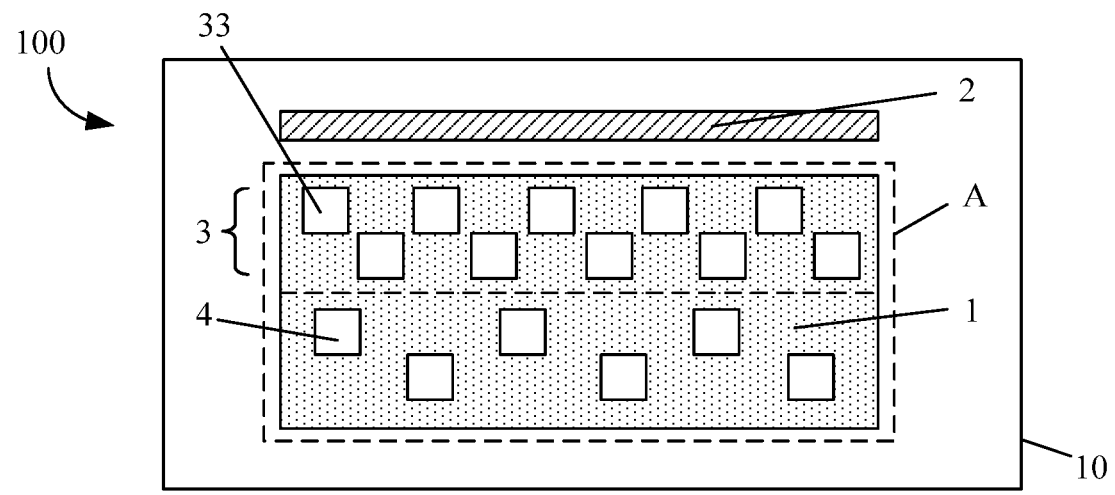
FIG. 6 is a schematic view of the array base plate according to yet exemplary embodiments of the present disclosure.

With reference to FIG. 6, for easy manufacture, the above-described through part 3 may also have a hole structure that is the same as the encapsulation hole 4. However, it shall be noted that the distribution density of the holes included in the through part 3 shall be greater than that of the plurality of encapsulation holes 4 on the side of the first patterned part 1 that is far away from the second patterned part 2. That is to say, in a same-sized area of the first patterned part 1, the number of holes in the through part 3 shall be larger than the number of the encapsulation holes 4. Of course, in the present embodiment, it is also possible to use the ratio of the area of the plurality of holes in the through part 3 to the area of some partition as the distribution density of the through part 3 including the plurality of holes, and the ratio of the area of the plurality of encapsulation holes 4 to the area of the same-sized partition as the distribution density of the plurality of encapsulation holes 4, and it shall be ensured that the distribution density of the through part 3 including the plurality of holes is greater than that of the plurality of encapsulation holes 4 in the same-sized partition.

Furthermore, in the array base plate 100 provided by the above embodiments, if the material of the side of the first patterned part 1 that is closer to the second patterned part 2 melts due to laser encapsulation and overflows into the through part 3, the overflown material may also serve as a local connecting line in the interior of the first patterned part 1 to locally connect the regions that are previously unconnected in the interior of the first patterned part 1. In the embodiment in which the first patterned part 1 is a metal wire, it can reduce the value of the total resistance of the first patterned part 1, and further the IR voltage drop of the first patterned part 1.

Figure 7:
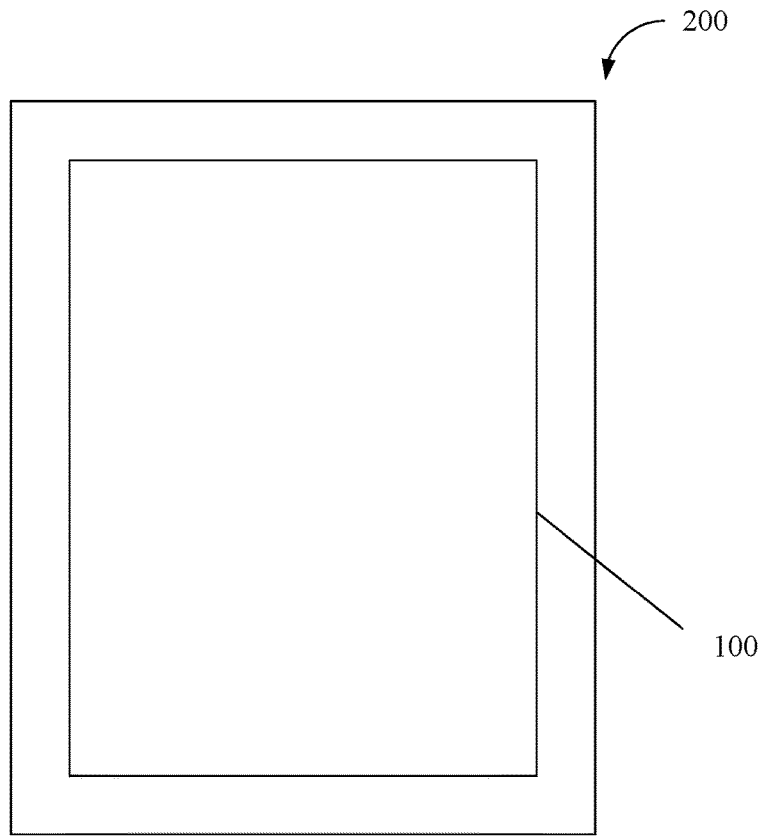
FIG. 7 schematically shows a display panel including the array base plate according to the exemplary embodiments of the present disclosure.

Now with reference to FIG. 7, there is also provided a display panel 200 according to some exemplary embodiments of the present disclosure. The display panel 200 comprises the array base plate 100 provided by the above embodiments. The array base plate 100 included in the display panel 200 has the same advantageous technical effects as the array base plate 100 in the above embodiments, which will not be reiterated herein.

Figure 8:
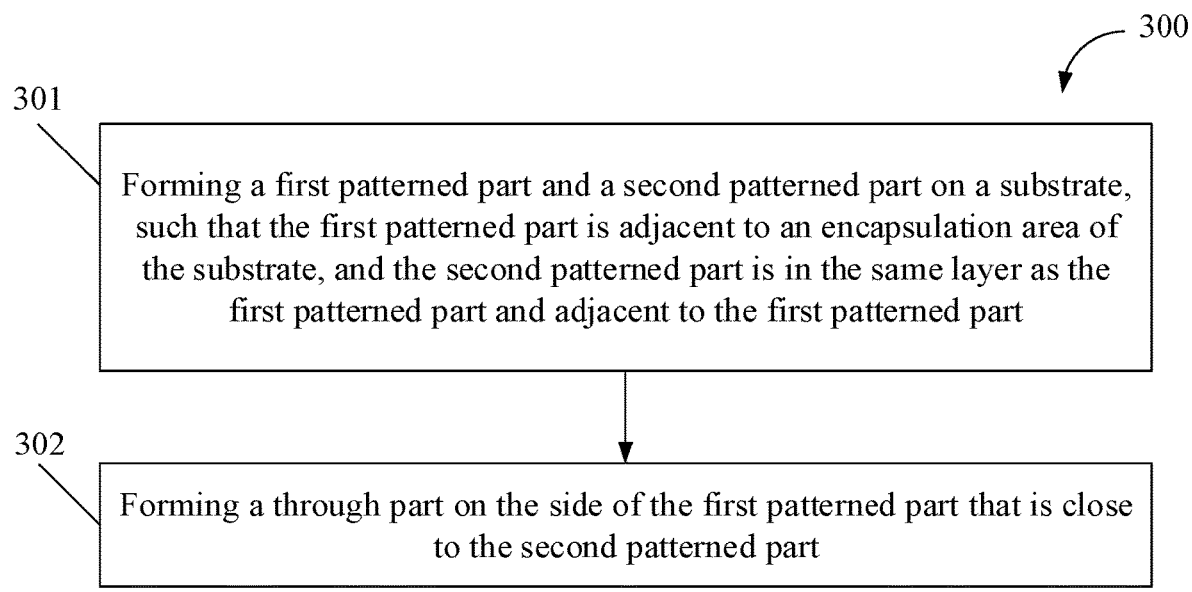
FIG. 8 schematically shows a manufacturing method for manufacturing the array base plate according to the exemplary embodiments of the present disclosure.

Now with reference to FIG. 8, it schematically shows a manufacturing method 300 for manufacturing the array base plate 100 according to some exemplary embodiments of the present disclosure. It shall be noted that the steps of the method described below are all exemplary, and not necessarily executed in the listed order. Rather, one or more of these steps can be executed in a different order or at the same time according to the actual situations. In addition, other additional steps can also be included according to the actual situations.

The manufacturing method 300 comprises the steps of:

Step 301: forming a first patterned part 1 and a second patterned part 2 on a substrate 10, such that the first patterned part 1 is adjacent to an encapsulation region A of the substrate 10, and the second patterned part 2 is in the same layer as the first patterned part 1 and adjacent to the first patterned part 1; and Step 302: forming a through part 3 on the side of the first patterned part 1 that is close to the second patterned part 2.

In some embodiments of the present disclosure, the through part 3 comprises at least one slot and/or at least one hole.

It should be understood that the first patterned part 1, the second patterned part 2 and the through part 3 can be manufactured by any suitable process known in the related art. In addition, the array base plate 100 according to the exemplary embodiments of the present disclosure may also comprise other film layers whose structure and arrangement may adopt any suitable material, structure and arrangement known in the related art, and may be manufactured by any suitable method known in the related art. For the purpose of brevity and clarity, these film layers and their manufacturing methods will not be described in the present application.

The above description is merely an explanation and depiction of the exemplary embodiments of the present disclosure. However, such explanation and depiction shall be regarded as illustrative and exemplary. The scope of the present disclosure is not limited thereto. Under the teaching of the present disclosure, anyone skilled in the art can readily conceive of various variations or replacements, which shall be deemed as falling within the scope of the present disclosure. Thus, the scope of protection of the present disclosure shall be determined by the scopes of protection of the appended claims.

What is claimed is:

1. An array base plate, comprising:
   a substrate;
   a first patterned part disposed on the substrate and adjacent to an encapsulation line of an encapsulation region of the substrate;
   a second patterned part disposed on the substrate, in a same layer as the first patterned part, separate from the first patterned part, and also adjacent to the same encapsulation line of the encapsulation region;
   wherein the first patterned part comprises a through part on its side close to the second patterned part, and the encapsulation line is between the through part and the second patterned part.

2. The array base plate according to claim 1, wherein the through part comprises a slot extending along an extending direction of the first patterned part.

3. The array base plate according to claim 1, wherein the through part comprises a plurality of slots parallel to each other and extending along an extending direction of the first patterned part, the plurality of slots correspondingly form a plurality of strips on the side of the first patterned part that is close to the second patterned part, and the plurality of strips are parallel to each other and extending along the extending direction of the first patterned part.

4. The array base plate according to claim 3, wherein along a direction from the first patterned part to the second patterned part, the closer a strip among the plurality of strips is to the second patterned part, the thinner the strip is.

5. The array base plate according to claim 3, wherein along a direction from the first patterned part to the second patterned part, the closer a slot among the plurality of slots is to the second patterned part, the wider the slot is.

6. The array base plate according to claim 1, wherein the through part comprises a plurality of holes.

7. The array base plate according to claim 6, wherein a shape of each of the plurality of holes is selected from the group consisting of circle, oval, triangle, rectangle, square and polygon.

8. The array base plate according to claim 6, wherein along a direction from the first patterned part to the second patterned part, the plurality of holes are arranged in a plurality of rows, with each row extending along an extending direction of the first patterned part.

9. The array base plate according to claim 8, wherein along the direction from the first patterned part to the second patterned part, the closer a row among the plurality of rows is to the second patterned part, the larger sum of areas of all the holes in the row.

10. The array base plate according to claim 9, wherein each hole has a same area, and along the direction from the first patterned part to the second patterned part, the closer a row among the plurality of rows is to the second patterned part, the larger number of holes in the row.

11. The array base plate according to claim 9, wherein each of the plurality of rows has a same number of holes, and along the direction from the first patterned part to the second patterned part, the closer a row among the plurality of rows is to the second patterned part, the larger area of each hole in the row.

12. The array base plate according to claim 8, wherein each hole has a same area, and each of the plurality of rows has a same number of holes.

13. The array base plate according to claim 1, wherein the first patterned part is provided with at least one encapsulation hole on its side that is far from the second patterned part.

14. The array base plate according to claim 1, wherein the first patterned part is a first metal wire, and the second patterned part is a second metal wire.

15. The array base plate according to claim 14, wherein the second metal wire is disposed in a display region of the substrate.

16. The array base plate according to claim 15, wherein the second metal wire comprises a gate line or a data line.

17. The array base plate according to claim 14, wherein the first metal wire is a Cu thin-film wire, an Al thin-film wire, or a Ti—Al—Ti composite thin-film wire.

18. A display panel comprising:
   an array base plate comprising:
      a substrate;
      a first patterned part disposed on the substrate and adjacent to an encapsulation line of an encapsulation region of the substrate;
      a second patterned part disposed on the substrate, in a same layer as the first patterned part, separate from the first patterned part, and also adjacent to the same encapsulation line of the encapsulation region;

wherein the first patterned part comprises a through part on its side close to the second patterned part, and the encapsulation line is between the through part and the second patterned part.

* * * * *